US007297467B2

(12) United States Patent
Vander Aa

(10) Patent No.: US 7,297,467 B2
(45) Date of Patent: Nov. 20, 2007

(54) METHOD OF MAKING A HEAT-SENSITIVE LITHOGRAPHIC PRINTING PLATE

(75) Inventor: Joseph Vander Aa, Rijmenam (BE)

(73) Assignee: AGFA Graphics NV, Mortsel (BE)

( * ) Notice: Subject to any disclaimer, the term of this patent is extended or adjusted under 35 U.S.C. 154(b) by 0 days.

(21) Appl. No.: 10/964,024

(22) Filed: Oct. 13, 2004

(65) Prior Publication Data

US 2005/0089802 A1 Apr. 28, 2005

Related U.S. Application Data

(60) Provisional application No. 60/514,838, filed on Oct. 27, 2003.

(30) Foreign Application Priority Data

Oct. 16, 2003 (EP) ................................ 03103828

(51) Int. Cl.
*G03F 7/14* (2006.01)
*G03F 7/30* (2006.01)
*G03F 7/38* (2006.01)

(52) U.S. Cl. ...................... 430/302; 430/309; 430/325; 430/330; 430/964; 101/463.1; 101/467

(58) Field of Classification Search ............. 430/270.1, 430/302, 309, 434, 435, 494, 944, 945, 330, 430/325, 964; 101/463.1, 467
See application file for complete search history.

(56) References Cited

U.S. PATENT DOCUMENTS

| | | | |
|---|---|---|---|
| 6,387,595 B1 | 5/2002 | Teng | |
| 2003/0170570 A1* | 9/2003 | Vander Aa et al. | 430/302 |
| 2003/0180658 A1* | 9/2003 | Goodin et al. | 430/270.1 |
| 2003/0224259 A1* | 12/2003 | Verschueren et al. | 430/19 |

FOREIGN PATENT DOCUMENTS

| | | |
|---|---|---|
| EP | 0 770 494 A2 | 5/1997 |
| EP | 0 816 070 A1 | 1/1998 |
| EP | 1 065 049 A1 | 1/2001 |
| EP | 1 092 555 A1 | 4/2001 |
| EP | 1 342 568 A1 | 9/2003 |

OTHER PUBLICATIONS

Search Report for EP 03 10 3828 (Feb. 16, 2004).

* cited by examiner

*Primary Examiner*—Richard L. Schilling
(74) *Attorney, Agent, or Firm*—Leydig, Voit & Mayer, Ltd

(57) ABSTRACT

A method of making a lithographic printing plate is disclosed which comprises the steps of
(1) providing a lithographic printing plate precursor comprising (i) a support having a hydrophilic surface or which is provided with a hydrophilic layer and (ii) a coating provided thereon which comprises hydrophobic thermoplastic polymer particles;
(2) exposing the precursor to IR-light or heat, thereby inducing coalescence of the thermoplastic polymer particles at exposed areas of the coating;
(3) applying a hydrophilic protective layer on the coating; and then,
(4) while the precursor is mounted on a print cylinder of a printing press, developing the precursor by supplying an aqueous dampening liquid and/or ink to said precursor while rotating said print cylinder whereby the coating and the hydrophilic protective layer are removed from the support on the non-exposed areas.
According to the above method, the hydrophilic protective layer can be applied by coating a solution by means a spray nozzle or a jet nozzle and wherein the applied hydrophilic protective layer improves clean-out in an on-press development.

35 Claims, No Drawings

METHOD OF MAKING A HEAT-SENSITIVE LITHOGRAPHIC PRINTING PLATE

CROSS-REFERENCE TO RELATED PATENT APPLICATIONS

This application claims the benefit of U.S. Provisional Application No. 60/514,838 filed Oct. 27, 2003, which is incorporated by reference. In addition, this application claims the benefit of European Application No. 03103828.4 filed Oct. 16, 2003, which is also incorporated by reference.

FIELD OF THE INVENTION

The present invention relates to a method for making a lithographic printing plate. More in particular, the present invention relates to a method wherein the lithographic printing plate precursor is coated with a hydrophilic protective layer after image-wise recording and before developing.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a plate precursor by means of a so-called plate-setter.

Different technologies are being used in computer-to-plate. A is number of them are thermal technologies wherein thermal plates, sensitive to heat or infrared light, are widely used in computer-to-plate methods. Such thermal materials may be exposed directly to heat, e.g. by means of a thermal head, but preferably comprise a compound that converts absorbed light into heat and are therefore suitable for exposure by lasers, especially infrared laser diodes. The heat, which is generated on image-wise exposure, triggers a (physico-)chemical process, such as ablation, polymerization, insolubilization by cross-linking of a polymer, decomposition, or particle coagulation of a thermoplastic polymer latex, and after optional processing, a lithographic image is obtained. Many thermal plate materials are based on heat-induced coagulation of thermoplastic polymer particles.

EP-A 1 065 049 discloses a heat-sensitive material for making lithographic printing plates comprising on a lithographic support an image-forming layer comprising a hydrophilic binder, a cross-linking agent for a hydrophilic binder and dispersed hydrophobic thermoplatic polymer particles, and a covering layer comprising an organic compound comprising cationic groups.

EP-A 770 494 discloses a method wherein an imaging material comprising an image-recording layer of a hydrophilic binder, a compound capable of converting light to heat and hydrophobic thermoplastic polymer particles, is image-wise exposed, thereby inducing coalescence of the polymer particles and converting the exposed areas into an hydrophobic phase which defines the printing areas of the printing master. The press run can be started immediately after exposure without any additional treatment because the layer is developed by interaction with the fountain and ink that are supplied to the cylinder during the press run. During the first runs of the press, the non-exposed areas are removed from the support and thereby define the non-printing areas of the plate. This on-press processing method provides only a rapid clean-out (i.e. complete removal of the non-image areas of the coating) if first fountain is supplied to the plate and then also ink. However, it is difficult for the end-user to avoid that the plate surface gets in touch with ink (or with inked parts) before the plate is wetted by the dampening liquid on the press. Plate handlings which are critical for such plate contamination are e.g. plate loading, mounting the plate on the press, etc. It is difficult to develop those parts contaminated by ink in the on-press processing step, i.e. clean-out of the non-image parts is only achieved after a large number of revolutions of the plate cylinder. As a result, the latitude of plate handlings is limited to an unpracticle or even unacceptable level for the end-user.

U.S. Pat. No. 6,387,595 discloses a lithographic printing plate wherein a photosensitive layer capable of hardening or solubilization upon exposure to actinic radiation and an overcoat with a covarage of from 0.001 to 0.150 $g/m^2$ which is soluble or dispersible in ink and/or fountain solution. The image-wise exposed material is on-press developable and the incorporation of this ultrathin overcoat provides excellent white light stability, high contrast, excellent ink receptivity and fast on-press development. However, the presence of such a thin overcoat of a water-soluble polymer, applied on the precursor of the present invention before image-wise exposing, has the drawback of reducing the sensitivity on heat-mode recording.

EP-A 816 070 discloses a heat sensitive imaging element comprising on a hydrophilic surface of a lithographic base an image forming layer including at least hydrophobic thermoplastic polymer particles and a compound capable of converting light into heat, and wherein, on the image forming layer, a covering layer is present having a thickness between 0.1 and 3 μm. However, there is no disclosure about a method wherein the covering layer is applied on the image forming layer after the exposure step and before processing the material.

EP-A 1 342 568 discloses a method of making a lithographic printing plate wherein an imaging material comprising an image-recording layer of a hydrophilic binder, a compound capable of converting light to heat and hydrophobic thermoplastic polymer particles, is image-wise exposed, thereby inducing coalescence of the polymer particles. The image-wise exposed material is processed by applying a gum solution to the image-recording layer, thereby removing non-exposed areas of the coating from the support. However, there is no disclosure about on-press processing with ink and fountain solution.

SUMMARY OF THE INVENTION

It is an object of the present invention to provide a method for making a lithographic printing plate showing an improved clean-out in an on-press development. This object is realized by the method as defined in claim 1 wherein a hydrophilic protective layer is applied on the coating of the precursor after the image-wise exposing step and before the on-press processing step.

Specific embodiments of the invention are defined in the dependent claims.

DETAILED DESCRIPTION OF THE INVENTION

In accordance with the present invention, there is provided a method of making a lithographic printing plate comprising the steps of (1) providing a lithographic printing plate precursor comprising (i) a support having a hydrophilic surface or which is provided with a hydrophilic layer and (ii) a coating provided thereon which comprises hydrophobic thermoplastic polymer particles;

(2) exposing the coating to IR-light or heat, thereby inducing coalescence of the thermoplastic polymer particles at exposed areas of the coating;

(3) applying a hydrophilic protective layer on the coating; and then, (4) while the precursor is mounted on a print cylinder of a printing press, developing the precursor by supplying an aqueous dampening liquid and/or ink to said precursor while rotating said print cylinder whereby the coating and the hydrophilic protective layer are removed from the support on the non-exposed areas.

As a result, by this method the clean-out in this on-press processing step is improved, i.e. the number of prints, necessary to obtain an on-press developed printing plate, is reduced, compared with the same method wherein no hydrophilic protective layer is applied after the image-wise exposing step and before the on-press processing step. By this method an improved protection of the printing plate precursor against fingerprints and against press chemicals such as blanket cleaner, may be also obtained.

The application of this hydrophilic protective layer on the coating of the precursor is carried out by coating and drying of a hydrophilic protective coating solution in such a way that on top of the precursor a hydrophilic layer is present. This hydrophilic layer is able to improve the clean-out, more particularly, those parts of the non-image areas which are contaminated by ink are removed by the on-press processing within a short time. The efficiency of the clean-out may depend on the method of coating this hydrophilic protective coating solution. In accordance with another embodiment of the present invention, said hydrophilic protective layer is preferably applied by coating a hydrophilic protective coating solution by means of a spray nozzle or a jet nozzle. These coating methods are preferred because there is no substantial mixing of the coating with the hydrophilic protective layer.

An example of a spray nozzle which can be used in the present invention, is an air assisted spray nozzle of the type SUJ1, commercially available at Spraying Systems Belgium, Brussels. The spray nozzle may be mounted on a distance of 50 mm to 200 mm between nozzle and receiving substrate. The flow rate of the spray solution may be set to 7 ml/min. During the spray process an air pressure in the range of $4.80\times10^5$ Pa may be used on the spray head. This layer may be dried during the spraying process and/or after the spraying process. Typical examples of jet nozzles are ink-jet nozzles and valve-jet nozzles.

Immediately after applying the coating solution the drying of the plate is preferably carried-out as fast as possible in order to prevent mixing of the layers as much as possible. The drying can be carried-out by means of a drying section of the plate processing machine or by means of a hot air device.

The efficiency of the clean-out also increases with the thickness of the layer. In accordance with another embodiment of the present invention, said hydrophilic protective layer has preferably a layer thickness of at least 0.2 $g/m^2$, more preferably of at least 0.3 $g/m^2$, most preferably of at least 0.4 $g/m^2$. There is no specific maximum thickness for this layer but typically the layer thickness is not higher than 2 $g/m^2$ or even 1.5 $g/m^2$.

In accordance with the present invention said hydrophilic protective coating solution comprises preferably a hydrophilic polymer and/or a surfactant.

Examples of hydrophilic polymers are polymers comprising ionic or ionisable groups or containing polyethyleneoxide groups. Examples of ionic or ionisable groups are acid groups or salts thereof such as carboxylic acid group, sulphonic acid, phosphoric acid or phosphonic acid. The acid groups in the polymer may be neutralized with an organic amine (e.g. ammonia, triethylamine, tributylamine, dimethylethanolamine, diisopropanolamine, morpholine, diethanolamine or triethanolamine) or an alkali metal (e.g. lithium, sodium or potassium). The polymer may be composed of a monomer comprising an anionic group. The polymer may also be composed of two or more different types of monomers comprising anionic and/or non-ionic groups. Specific examples of monomers comprising anionic groups are (meth)acrylic acid, crotonic acid, (meth)acrylic acid, propyl(meth)acrylic acid, isopropyl(meth)acrylic acid, itaconic acid, fumaric acid, sulfoethyl(meth)acrylate, butyl (meth)acrylamidesulfonic acid and phosphoethyl(meth) acrylate. In general, the number average molecular weight of the polymer is preferably in the range of about 1,000 to 3,000,000 g/mol.

Specific examples of hydrophilic polymers are gum arabic, alginic acid, pullulan, cellulose derivatives such as carboxymethylcellulose, carboxyethylcellulose or methylcellulose, (cyclo)dextrin, poly(vinyl alcohol), polystyrene sulphonic acid and salts thereof such as sodium, potassium or ammonium salt, poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid. Other examples of hydrophilic polymers are those typically known in gumming solutions.

Said surfactant is preferably an ionic surfactant or nonionic surfactant.

Specific examples of anionic surfactants include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates. Other examples of suitable anionic surfactants include sodium dodecylphenoxybenzene disulfonate, the sodium salt of alkylated naphthalenesulfonate, disodium methylene-dinaphtalene-disulfonate, sodium dodecyl-benzenesulfonate, sulfonated alkyl-diphenyloxide, ammonium or potassium perfluoroalkylsulfonate and sodium dioctyl-sulfosuccinate.

The non-ionic surfactant comprises preferably ethylene-oxide groups and/or propylene-oxide groups. Specific examples of the nonionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers and poloxyethylene-polyoxypropylene block polymers. Further, fluorinic and siliconic anionic and non-ionic surfactants may be similarly used.

Examples non-ionic and anionic surfactants according to the present invention are:

GAFAC™ RM710, an alkylphenoxy polyethoxy dihydrogen-phosphate from GENERAL ANILINE;

ANTAROX™ B290, a condensation product of caster oil with a ca. 40 unit long polyethyleneoxide chain from GENERAL ANILINE;

ANTAROX™ C0880, nonylphenoxy polyethoxy ethanol with about 30 polyethoxy units from GENERAL ANILINE;

ULTRAVON™ W, a sodium salt of an alkaryl sulfonate from CIBA-GEIGY;

MERSOLAT™ H, a sodium salt of an alkyl sulfonate from BAYER;

MARLON™ A-396, a sodium salt of dodecylbenzene sulfonate from HULS;

AEROSOL™ OT, a sodium salt of the bis-(2'-ethylhexyl) ester of sulfosuccinic acid from AMERICAN CYANAMID;

HOSTAPON™ T, a sodium β-(methyl-oleyl-amino)ethyl-sulfonate from is HOECHST;

HOSTAPAL™ BV, a sodium 2,4,6-tributylphenoxy polyethoxy sulfonate from HOECHST;

NEFAL™ BX, a sodium salt of 4,7-dibutyl-2-sulfonaphthalene from BASF;

AKYPO™ OP-80, a sodium salt of octylphenoxy-polyethoxy-acetic acid from CHEMY;

TERGITOL™ 4, a sodium salt of 1-isobutyl-4-ethyl-octyl-sulfate from UNION CARBIDE;

ERKANTOL™ BX, a sodium salt of 4,7-bis(isobutyl)-2-naphthalenesulfonic acid from BAYER;

ALKANOL™ XC, a sodium salt of tris(isopropyl)naphthalene-sulfonic acid from DU PONT;

DOWFAX™ 3B2, a sodium salt of a mono-or di-alkyl substituted diphenylether-sulphonic acid from DOW.

Two or more surfactants, selected from anionic and/or non-ionic surfactants, may be used in combination. For example, a combination of two or more different anionic surfactants or a combination of an anionic surfactant and a nonionic surfactant may be preferred.

Said hydrophilic protective coating solution may further comprise an aqueous liquid. Such aqueous liquids include water and mixtures of water with water-miscible organic solvents such as alcohols e.g. methanol, ethanol, 2-propanol, butanol, iso-amyl alcohol, octanol, cetyl alcohol etc; glycols e.g. ethylene glycol; glycerine; N-methylpyrrolidone; methoxypropanol; and ketones e.g. 2-propanone and 2-butanone etc.

Said protective coating solution may further comprise a mineral acid, an organic acid or an inorganic salt. Examples of the mineral acids include nitric acid, sulfuric acid, phosphoric acid and metaphosphoric acid. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid. Examples of the inorganic salt include magnesium nitrate, monobasic sodium phosphate, dibasic sodium phosphate, nickel sulfate, sodium hexametaphosphate and sodium tripolyphosphate. Other inorganic salts can be used as corrosion inhibiting agents, e.g. magnesium sulfate or zinc nitrate. The mineral acid, organic acid or inorganic salt may be used singly or in combination with one or more thereof.

Besides the foregoing components, the hydrophilic protective coating solution may further comprise a wetting agent such as ethylene glycol, propylene glycol, triethylene glycol, butylene glycol, hexylene glycol, diethylene glycol, dipropylene glycol, glycerin, trimethylol propane and diglycerin. The wetting agent may be used singly or in combination with one or more thereof. In general, the foregoing wetting agent is preferably used in an amount of from 1 to 25 wt. % of the coating solution of the contrast layer.

Further, a chelate compound may be present in the hydrophilic protective coating solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1, 1-diphosphonic acid and aminotri(methylenephosphonic acid). Besides these sodium or potassium salts of these chelating agents, organic amine salts are useful. The preferred amount of such a chelating agent to be added is from 0.001 to 1.0 wt. % relative to the contrast coating solution.

Further, an antiseptic and an anti-foaming agent may be present in the hydrophilic protective coating solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the contrast coating solution. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the contrast coating solution.

Besides the foregoing components, an ink receptivity agent may be present in the hydrophilic protective coating solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the hydrophilic protective coating solution can be adjusted to a value of e.g. between 1.5 and 5 mPa·s, by adding viscosity increasing compounds, such as poly(ethylene oxide), e.g. having a molecular weight between $10^5$ and $10^7$ g/mol. Such compounds can be present in a concentration of 0.01 to 10 g/l.

The lithographic printing plate precursor used in the method of the present invention is negative-working and develops a lithographic image consisting of hydrophobic and hydrophilic areas at the exposed and non-exposed areas respectively. The hydrophilic areas are defined by the support which has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer is obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in e.g. EP-A 1 025 992.

The coating provided on the support contains particles comprising hydrophobic thermoplastic polymers. Specific examples of suitable hydrophobic thermoplastic polymers are e.g. polyethylene, poly(vinyl chloride), poly(methyl (meth)acrylate), poly(ethyl (meth)acrylate), poly(vinylidene chloride), poly(meth)acrylonitrile, poly(vinyl carbazole), polystyrene or copolymers thereof. Polystyrene and poly (meth)acrylonitrile or their derivatives are highly preferred embodiments. According to such preferred embodiments, the thermoplastic polymer comprises at least 50 wt. % of polystyrene, and more preferably at least 60 wt. % of polystyrene. In order to obtain sufficient resistivity towards organic chemicals, such as the hydrocarbons used in plate cleaners, the thermoplastic polymer preferably comprises at least 5 wt. %, more preferably at least 30 wt. % of nitrogen containing monomeric units or of units which correspond to monomers that are characterized by a solubility parameter larger than 20, such as (meth)acrylonitrile. Suitable examples of such nitrogen containing monomeric units are disclosed in European Patent Application no. 01000657, filed on Nov. 23, 2001.

According to the most preferred embodiment, the hydrophobic thermoplastic polymer is a copolymer consisting of styrene and acrylonitrile units in a weight ratio between 1:1 and 5:1 (styrene:acrylonitrile), e.g. in a 2:1 ratio.

The weight average molecular weight of the hydrophobic thermoplastic polymers may range from 5,000 to 1,000,000 g/mol. The hydrophobic thermoplastic polymer particles preferably have a number average particle diameter below 200 nm, more preferably between 10 and 100 nm. The amount of hydrophobic thermoplastic polymer particles contained in the coating is preferably between 20 wt. % and 65 wt. % and more preferably between 25 wt. % and 55 wt. % and most preferably between 30 wt. % and 45 wt. %.

The hydrophobic thermoplastic polymer particles may be present as a dispersion in an aqueous coating liquid and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The coating preferably comprises a hydrophilic binder. The hydrophilic binders are preferably polymers which do not comprise cationic groups. The most preferred hydrophilic binders are polymers comprising anionic or non-ionic groups. Typical examples of suitable hydrophilic polymers are homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The coating may also contain other ingredients such as additional binders, development inhibitors or accelerators, and especially one or more compounds that are capable of converting infrared light into heat. Particularly useful light-to-heat converting compounds are for example infrared dyes.

The coating, comprising a hydrophilic binder and hydrophobic thermoplastic polymer particles, is preferably not or only slightly cross-linked.

The printing plate precursors used in the method of the present invention are exposed to heat or to infrared light, e.g. by means of a thermal head, LEDs or an infrared laser. Preferably, a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi). Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 50 mW to about 1 W operate at a lower scan speed, e.g. from 0.1 to 10 m/sec.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

In a specific configuration, the printing plate precursor is mounted on a printing press and consecutively on the press the image recording step by laser exposure, the coating of the protective layer by spraying or jetting the protective coating solution, the drying step of the coated protective layer and the developing step is with the dampening liquid and ink may be carried out, followed by the (long run) printing process.

EXAMPLES

Comparative Example 1

Preparation of the Lithographic Support:

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained during 15 seconds using an alternating current in an aqueous solution containing 12 g/l of hydrochloric acid and 38 g/l of aluminum sulfate (18-hydrate) at a temperature of 33° C. and a current density of 90 $A/dm^2$. After rinsing with demineralized water for 2 seconds, the aluminum foil was then desmutted by etching with an aqueous solution containing 155 g/l of sulfuric acid at 70° C. for 4 seconds and rinsed with demineralized water at 25° C. for 2 seconds. The foil was subsequently subjected to anodic oxidation during 13 seconds in an aqueous solution containing 155 g/l of sulfuric acid at a temperature of 45° C. and a current density of 30 $A/dm^2$, then washed with demineralized water for 2 seconds and post-treated for 10 seconds with a solution containing 4 g/l of polyvinylphosphonic acid at 40° C., rinsed with demineralized water at 20° C. during 2 seconds and dried.

The support thus obtained was characterized by a surface roughness Ra of 0.22 μm and had an anodic weight of 4.0 $g/m^2$ of $Al_2O_3$.

Preparation of Printing Plate Precursor:

Onto the above described lithographic support an image-recording layer was coated from an aqueous coating solution at a wet thickness of 30 $g/m^2$. After drying, the layer consisted of 600 $mg/m^2$ of a copolymer of styrene and acrylonitrile (weight ratio 60/40) having an average particle size of 65 nm, stabilized with an anionic wetting agent, 60 $mg/m^2$ of infrared absorbing Dye-1 and 120 $mg/m^2$ of polyacrylic acid (Glascol E15 from Allied Colloids).

Dye-1

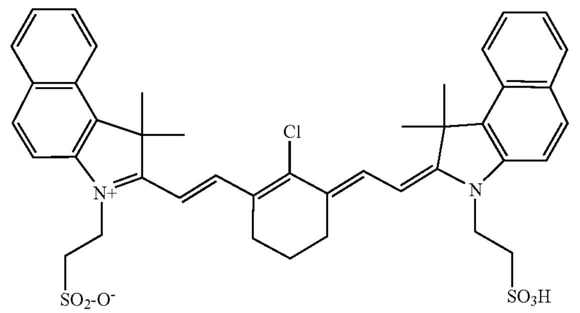

Exposure of the printing plate precursor:

The plate precursor thus obtained was exposed with a CREO TRENDSETTER 3244 TH957, a plate-setter available from CREO, Burnaby, Canada), having the following specifications: power-output of the laser head 40 Watt, wavelength 830 nm, drum diameter 286 mm, number of beams 192, spotsize 10.6×2.5 micron (slowscan×fastscan), operating at 275 $mJ/cm^2$ and 150 rpm and with a resolution of 2400 dpi.

On-Press processing of the plate:

After imaging, the plate was mounted on a GTO 46 printing press (available from Heidelberger Druckmaschinen AG), and the on-press processing was started by supplying fountain liquid, namely 4% Combifix XL with 10% isopropanol, and ink, namely K+E 800. When the plate precursor was mounted, the ik rollers were brought in contact with the plate during press stilstand for 1 minute, so that ink stripes were left on the plate, in order to simulate contamination by ink. In the start-up the dampening rollers were brought in contact with the plate during 5 revolutions and subsequently the ink rollers were also brought in contact with the plate during 5 revolutions. Subsequently the clean-out was observed during the roll-up: the ink roller stripes disappear after 50 a 100 printed sheets.

Invention Examples 1 and 2

The same printing plate precursor on the same support as described in the Comparative example 1 was exposed and on-press processed in the same way as described in the Comparative example 1, with the exception that, after imaging exposure and before the on-press processing step, the coating of the plate precursor was sprayed with the RC520 solution, commercially available from AGFA, in an amount of 5.5 $ml/m^2$ for the INVENTION EXAMPLE 1 and 11 $ml/m^2$ for the INVENTION EXAMPLE 2. The RC520 solution is an aqueous solution of the surfactant DOWFAX 3B2 in a concentration of 39.3 g/l, citric acid.1aq in a concentration of 9.8 g/l, and trisodium citrate.2aq in a concentration of 32.6 g/l, and the RC520 solution has a pH-value of about 5. Immediatly after spraying, the plate was dried by means of the heating element of the Heights Clean Out Unit of the press. The same method as described in the Comparative Example 1 was carried out for the on-press processing of the plate. We observed that the ink roller stripes disappear more quickly, namely after 30 printed sheets in the INVENTION EXAMPLE 1 and after 15 printed sheets in the INVENTION EXAMPLE 2. These examples demonstrate that the spray coated plates of the INVENTION EXAMPLES 1 and 2 exhibit a much faster clean-out than in the Comparative Example 1.

The invention claimed is:

1. A method of making a lithographic printing plate comprising the steps of (a) providing a lithographic printing plate precursor comprising (i) a support having a hydrophilic surface or which is provided with a hydrophilic layer and (ii) a coating provided thereon which comprises hydrophobic thermoplastic polymer particles;

(b) exposing the precursor to IR-light or heat, thereby inducing coalescence of the thermoplastic polymer particles at exposed areas of the coating;

(c) applying a hydrophilic protective layer on the coating without completely removing the coating on the non-exposed areas;

(d) mounting the precursor on a print cylinder of a printing press; and (e) developing the precursor by supplying an aqueous dampening liquid and/or ink to said precursor while rotating said print cylinder whereby the coating and the hydrophilic protective layer are removed from the support on the non-exposed areas, wherein step (c) is carried out afier step (b) and before step (d).

2. The method according to claim 1, wherein said hydrophilic protective layer comprises a hydrophilic polymer and/or a surfactant.

3. The method according to claim 2, wherein said hydrophilic polymer comprises anionic groups or non-ionic groups.

4. The method according to claim 2, wherein said hydrophilic polymer is a polymer or copolymer of polyvinylalcohol, poly(meth)acrylic acid, polystyrene sulphonic acid, poly(meth)acrylamide, polyhydroxyethyl(meth)acrylate, polyvinylmethylether, polyvinylpyrrolidone, polysaccharide, gelatine, arabic gum, alginic acid or salts thereof.

5. The method according to claim 2, wherein said surfactant is an anionic or non-ionic surfactant.

6. The method according to claim 1, wherein said hydrophilic protective layer is applied by coating a solution comprising a hydrophilic polymer and/or a surfactant by means of a spray nozzle or a jet nozzle.

7. The method according to claim 6, wherein said jet nozzle is an ink jet nozzle or a valve jet nozzle.

8. The method according to claim 1, wherein said hydrophilic protective layer has a layer thickness of at least 0.2 $g/m^2$.

9. The method according to claim 1, wherein said hydrophobic thermoplastic particles comprise a copolymer of styrene and at least 5 mole % of a nitrogen-containing monomer.

10. The method according to claim 1, wherein the coating further comprises a compound which is capable of converting infrared light into heat, and wherein the exposure step is performed by exposing the precursor to infrared light.

11. The method according to claim 2, wherein said hydrophilic protective layer is applied by coating a solution comprising a hydrophilic polymer and/or a surfactant by means of a spray nozzle or a jet nozzle.

12. The method according to claim 3, wherein said hydrophilic protective layer is applied by coating a solution comprising a hydrophilic polymer and/or a surfactant by means of a spray nozzle or a jet nozzle.

13. The method according to claim 4, wherein said hydrophilic protective layer is applied by coating a solution comprising a hydrophilic polymer and/or a surfactant by means of a spray nozzle or a jet nozzle.

14. The method according to claim 5, wherein said hydrophilic protective layer is applied by coating a solution comprising a hydrophilic polymer and/or a surfactant by means of a spray nozzle or a jet nozzle.

15. The method according to claim 2, wherein said hydrophilic protective layer has a layer thickness of at least 0.2 $g/m^2$.

16. The method according to claim 3, wherein said hydrophilic protective layer has a layer thickness of at least 0.2 $g/m^2$.

17. The method according to claim 4, wherein said hydrophilic protective layer has a layer thickness of at least 0.2 $g/m^2$.

18. The method according to claim 5, wherein said hydrophilic protective layer has a layer thickness of at least 0.2 $g/m^2$.

19. The method according to claim 6, wherein said hydrophilic protective layer has a layer thickness of at least 0.2 $g/m^2$.

20. The method according to claim 7, wherein said hydrophilic protective layer has a layer thickness of at least 0.2 $g/m^2$.

21. The method according to claim 2, wherein said hydrophobic thermoplastic particles comprise a copolymer of styrene and at least 5 mole % of a nitrogen-containing monomer.

22. The method according to claim 3, wherein said hydrophobic thermoplastic particles comprise a copolymer of styrene and at least 5 mole % of a nitrogen-containing monomer.

23. The method according to claim 4, wherein said hydrophobic thermoplastic particles comprise a copolymer of styrene and at least 5 mole % of a nitrogen-containing monomer.

24. The method according to claim 5, wherein said hydrophobic thermoplastic particles comprise a copolymer of styrene and at least 5 mole % of a nitrogen-containing monomer.

25. The method according to claim 6, wherein said hydrophobic thermoplastic particles comprise a copolymer of styrene and at least 5 mole % of a nitrogen-containing monomer.

26. The method according to claim 7, wherein said hydrophobic thermoplastic particles comprise a copolymer of styrene and at least 5 mole % of a nitrogen-containing monomer.

27. The method according to claim 8, wherein said hydrophobic thermoplastic particles comprise a copolymer of styrene and at least 5 mole % of a nitrogen-containing monomer.

28. The method according to claim 2, wherein the coating further comprises a compound which is capable of converting infrared light into heat, and wherein the exposure step is performed by exposing the precursor to infrared light.

29. The method according to claim 3, wherein the coating further comprises a compound which is capable of converting infrared light into heat, and wherein the exposure step is performed by exposing the precursor to infrared light.

30. The method according to claim 4, wherein the coating further comprises a compound which is capable of converting infrared light into heat, and wherein the exposure step is performed by exposing the precursor to infrared light.

31. The method according to claim 5, wherein the coating further comprises a compound which is capable of converting infrared light into heat, and wherein the exposure step is performed by exposing the precursor to infrared light.

32. The method according to claim 6, wherein the coating further comprises a compound which is capable of converting infrared light into heat, and wherein the exposure step is performed by exposing the precursor to infrared light.

33. The method according to claim 7, wherein the coating further comprises a compound which is capable of converting infrared light into heat, and wherein the exposure step is performed by exposing the precursor to infrared light.

34. The method according to claim 8, wherein the coating further comprises a compound which is capable of converting infrared light into heat, and wherein the exposure step is performed by exposing the precursor to infrared light.

35. The method according to claim 9, wherein the coating further comprises a compound which is capable of converting infrared light into heat, and wherein the exposure step is performed by exposing the precursor to infrared light.

* * * * *